United States Patent
Jussila et al.

(10) Patent No.: US 12,359,315 B2
(45) Date of Patent: Jul. 15, 2025

(54) DEPOSITION OF OXIDES AND NITRIDES

(71) Applicant: ASM IP Holding B.V., Almere (NL)

(72) Inventors: Henri Jussila, Espoo (FI); Chiyu Zhu, Helsinki (FI); Qi Xie, Leuven (BE); Jiyeon Kim, Helsinki (FI); Tom E. Blomberg, Vantaa (FI)

(73) Assignee: ASM IP Holding B.V., Almere (NL)

( * ) Notice: Subject to any disclaimer, the term of this patent is extended or adjusted under 35 U.S.C. 154(b) by 481 days.

(21) Appl. No.: 16/748,299

(22) Filed: Jan. 21, 2020

(65) Prior Publication Data

US 2020/0263297 A1    Aug. 20, 2020

Related U.S. Application Data

(60) Provisional application No. 62/805,634, filed on Feb. 14, 2019.

(51) Int. Cl.
*C23C 16/455* (2006.01)
*C23C 16/34* (2006.01)
(Continued)

(52) U.S. Cl.
CPC ........ *C23C 16/45527* (2013.01); *C23C 16/34* (2013.01); *C23C 16/401* (2013.01);
(Continued)

(58) Field of Classification Search
CPC ........ C23C 16/45527; C23C 16/45553; C23C 16/401; C23C 16/34; C23C 16/402;
(Continued)

(56) References Cited

U.S. PATENT DOCUMENTS

| 3,405,801 A | 10/1968 | Zwiacher et al. |
| 3,708,728 A | 1/1973 | Sterling et al. |
| (Continued) | | |

FOREIGN PATENT DOCUMENTS

| DE | 410873 | 8/1923 |
| EP | 0387403 | 9/1990 |
| (Continued) | | |

OTHER PUBLICATIONS

Definition: Metal-Oxide Semiconductor, https://www.merriam-webster.com/dictionary/metal-oxide%20semiconductor accessed online May 7, 2021 (Year: 2021).*
(Continued)

*Primary Examiner* — Michael G Miller
(74) *Attorney, Agent, or Firm* — Banner & Witcoff, Ltd.

(57) ABSTRACT

Vapor deposition processes such as atomic layer deposition (ALD) processes employing a deposition enhancing precursor can be used to form a variety of oxide and nitride films, including metal oxide, metal nitride, metal oxynitride, silicon oxide and silicon nitride films. For example, the methods can be used to deposit transition metal nitrides, transition metal oxides, and silicon oxides and nitrides. In some embodiments the deposition enhancing precursor comprises a Group II metal such as Mg, Sr, Ba or Ca. Atomic layer deposition processes may comprise a deposition cycle comprising a first sub-cycle in which a substrate is contacted with a deposition enhancing precursor and an oxygen or nitrogen reactant and a second sub-cycle in which the substrate is contacted with a metal or silicon precursor and an oxygen or nitrogen reactant. In some embodiments the methods advantageously enable improved thin film formation, for example increased deposition rates.

1 Claim, 1 Drawing Sheet

(51) Int. Cl.
*C23C 16/40* (2006.01)
*H01L 21/02* (2006.01)

(52) U.S. Cl.
CPC .. *C23C 16/45553* (2013.01); *H01L 21/02205* (2013.01); *H01L 21/0228* (2013.01); *H01L 21/02164* (2013.01); *H01L 21/0217* (2013.01); *H01L 21/02186* (2013.01)

(58) Field of Classification Search
CPC . C23C 16/345; C23C 16/40; C23C 16/45534; C23C 16/308; C23C 16/45536; H01L 21/0228; H01L 21/02205; H01L 21/02186; H01L 21/02164; H01L 21/0217; H01L 21/28562; H01L 21/02175; H01L 21/32051; H01L 21/02211
USPC .............................. 427/248.1–255.7
See application file for complete search history.

(56) References Cited

U.S. PATENT DOCUMENTS

| | | |
|---|---|---|
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,477,296 A | 10/1984 | Nair |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,372,962 A | 12/1994 | Hirota et al. |
| 5,382,333 A | 1/1995 | Ando et al. |
| 5,453,494 A | 9/1995 | Kirlin et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,626,650 A | 5/1997 | Rodriguez et al. |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,731,634 A | 3/1998 | Matsuo et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,865,365 A | 2/1999 | Nishikawa et al. |
| 5,916,365 A | 6/1999 | Sherman |
| 5,939,334 A | 8/1999 | Nguyen et al. |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,007,685 A * | 12/1999 | MacChesney ...... C23C 14/3414 204/192.15 |
| 6,015,590 A | 1/2000 | Suntola et al. |
| 6,033,584 A | 3/2000 | Ngo et al. |
| 6,066,892 A | 5/2000 | Ding et al. |
| 6,087,257 A | 7/2000 | Park et al. |
| 6,090,666 A | 7/2000 | Ueda et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,124,189 A | 9/2000 | Watanabe et al. |
| 6,130,123 A | 10/2000 | Liang et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,303,500 B1 | 10/2001 | Jiang et al. |
| 6,323,131 B1 | 11/2001 | Obeng et al. |
| 6,342,277 B1 | 1/2002 | Sherman |
| 6,346,151 B1 | 2/2002 | Jiang et al. |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntoloa et al. |
| 6,420,279 B1 | 7/2002 | Ono et al. |
| 6,433,432 B2 | 8/2002 | Shimizu |
| 6,444,868 B1 | 9/2002 | Vaughn et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,569,529 B1 | 5/2003 | Phillips et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,824,816 B2 | 11/2004 | Aaltonen et al. |
| 6,827,978 B2 | 12/2004 | Yoon et al. |
| 6,833,161 B2 | 12/2004 | Wang et al. |
| 6,852,635 B2 | 2/2005 | Satta et al. |
| 6,858,546 B2 | 2/2005 | Niinistö et al. |
| 6,863,727 B1 | 3/2005 | Elers et al. |
| 6,902,763 B1 | 6/2005 | Elers et al. |
| 6,913,789 B2 | 7/2005 | Smalley et al. |
| 6,914,335 B2 | 7/2005 | Andideh et al. |
| 6,921,712 B2 | 7/2005 | Soininen et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,064,066 B1 | 6/2006 | Metz et al. |
| 7,105,054 B2 | 9/2006 | Lindfors |
| 7,108,747 B1 | 9/2006 | Leskelä et al. |
| 7,118,779 B2 | 10/2006 | Verghese et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,405,158 B2 | 7/2008 | Lai et al. |
| 7,416,981 B2 | 8/2008 | Lee et al. |

(56) References Cited

U.S. PATENT DOCUMENTS

| | | |
|---|---|---|
| 7,438,949 B2 | 10/2008 | Weidman |
| 7,489,545 B2 | 2/2009 | Forbes et al. |
| 7,491,634 B2 | 2/2009 | Huotari et al. |
| 7,595,263 B2 | 9/2009 | Chung et al. |
| 7,704,896 B2 | 4/2010 | Haukka et al. |
| 7,923,382 B2 | 4/2011 | Huotari et al. |
| 8,545,936 B2 | 10/2013 | Huotari et al. |
| 8,667,654 B2 | 3/2014 | Gros-Jean |
| 8,795,771 B2 | 8/2014 | Barry et al. |
| 8,841,182 B1 | 9/2014 | Chen et al. |
| 8,846,550 B1 | 9/2014 | Shero et al. |
| 8,993,055 B2 | 3/2015 | Rahtu et al. |
| 9,111,749 B2 | 8/2015 | Shero et al. |
| 9,236,247 B2 | 1/2016 | Chen et al. |
| 10,297,444 B2 | 5/2019 | Rahtu et al. |
| 10,964,534 B2 | 3/2021 | Rahtu et al. |
| 2001/0003064 A1 | 6/2001 | Ohto |
| 2001/0018266 A1 | 8/2001 | Jiang et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0013487 A1 | 1/2002 | Norman et al. |
| 2002/0027286 A1 | 3/2002 | Sundararajan et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0102691 A1 | 6/2003 | Schlecht et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0165615 A1 | 9/2003 | Aaltonen et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1 | 11/2003 | Derderian et al. |
| 2004/0005753 A1 | 1/2004 | Kostamo et al. |
| 2004/0130029 A1 | 7/2004 | Raaijmakers et al. |
| 2004/0175905 A1* | 9/2004 | Won .................. C23C 16/515 |
| | | 438/478 |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0214354 A1 | 10/2004 | Marsh et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0256662 A1 | 12/2004 | Black et al. |
| 2005/0004386 A1 | 1/2005 | Deschler et al. |
| 2005/0037557 A1 | 2/2005 | Doczy et al. |
| 2005/0048794 A1 | 3/2005 | Brask et al. |
| 2005/0089632 A1 | 4/2005 | Vehkamaki et al. |
| 2005/0092247 A1 | 5/2005 | Schmidt et al. |
| 2005/0106877 A1 | 5/2005 | Elers et al. |
| 2005/0161817 A1* | 7/2005 | Meyer ............... H01L 21/76846 |
| | | 257/751 |
| 2005/0208754 A1 | 9/2005 | Kostamo et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0046384 A1 | 3/2006 | Joo et al. |
| 2006/0079090 A1 | 4/2006 | Elers et al. |
| 2006/0121733 A1 | 6/2006 | Kilpela et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2006/0240189 A1 | 10/2006 | Ger et al. |
| 2006/0252244 A1 | 11/2006 | Vaartstra et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0054046 A1 | 3/2007 | Ishizaka et al. |
| 2007/0148347 A1 | 6/2007 | Hatanpaa et al. |
| 2007/0166970 A1 | 7/2007 | Triyoso et al. |
| 2007/0190780 A1 | 8/2007 | Chung et al. |
| 2007/0196575 A1 | 8/2007 | Dominguez et al. |
| 2007/0218670 A1 | 9/2007 | Ishizaka |
| 2007/0254488 A1 | 11/2007 | Huotari et al. |
| 2008/0079111 A1* | 4/2008 | Clark ............... H01L 21/02175 |
| | | 257/506 |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2008/0317972 A1* | 12/2008 | Hendriks ............... C23C 16/401 |
| | | 427/569 |
| 2009/0035946 A1 | 2/2009 | Pierreux et al. |
| 2009/0081868 A1 | 3/2009 | Shah et al. |
| 2009/0315093 A1 | 12/2009 | Li et al. |
| 2009/0321936 A1 | 12/2009 | Kojima et al. |
| 2010/0004372 A1 | 1/2010 | Goto et al. |
| 2010/0207053 A1 | 8/2010 | Ryu et al. |
| 2011/0315961 A1 | 12/2011 | Chen et al. |
| 2012/0292602 A1 | 11/2012 | Guo et al. |
| 2013/0043545 A1 | 2/2013 | Lee et al. |
| 2013/0078454 A1 | 3/2013 | Thompson et al. |
| 2013/0153963 A1* | 6/2013 | Shealy ............... H01L 29/66431 |
| | | 257/190 |
| 2013/0309417 A1* | 11/2013 | Matero ................ C23C 16/40 |
| | | 427/576 |
| 2014/0030447 A1 | 1/2014 | Lee et al. |
| 2014/0051261 A1 | 2/2014 | Ota et al. |
| 2015/0162185 A1 | 6/2015 | Pore |
| 2017/0247256 A1 | 8/2017 | Zhang et al. |

FOREIGN PATENT DOCUMENTS

| | | |
|---|---|---|
| EP | 0394054 | 10/1990 |
| EP | 0442490 | 8/1991 |
| EP | 0469470 | 2/1992 |
| EP | 0526779 | 2/1993 |
| EP | 0528779 | 2/1993 |
| EP | 0573033 | 12/1993 |
| EP | 0511264 | 8/1995 |
| EP | 0774533 | 5/1997 |
| EP | 0880168 | 11/1998 |
| EP | 0899779 | 3/1999 |
| EP | 1158070 | 11/2001 |
| EP | 1167567 | 1/2002 |
| GB | 2340508 | 2/2000 |
| JP | 58-033841 | 2/1983 |
| JP | H06-037041 | 2/1994 |
| JP | H06-069157 | 3/1994 |
| JP | H07-230957 | 8/1995 |
| JP | H08-264530 | 10/1996 |
| JP | 09-087857 | 3/1997 |
| JP | H11-3864 | 1/1999 |
| JP | 2005248231 A | 9/2005 |
| KR | 2001-88044 | 12/2001 |
| KR | 2002-31160 | 6/2002 |
| KR | 2002-87192 | 12/2002 |
| KR | 2003-0016346 | 2/2003 |
| KR | 2003-14115 | 3/2003 |
| KR | 2003-14117 | 3/2003 |
| KR | 2003-33234 | 5/2003 |
| KR | 2003-40758 | 6/2003 |
| KR | 2003-0057938 | 7/2003 |
| KR | 2003-0093575 | 12/2003 |
| KR | 20040005568 A | 1/2004 |
| KR | 2004-0060402 | 7/2004 |
| KR | 10-2004-0078476 A | 9/2004 |
| KR | 2004-0100767 | 12/2004 |
| KR | 2005-0000168 | 1/2005 |
| KR | 20090013111 A | 2/2009 |

(56) References Cited

FOREIGN PATENT DOCUMENTS

| | | |
|---|---|---|
| KR | 20140112440 A | 9/2014 |
| TW | 200720474 A | 6/2007 |
| WO | WO 1993/10652 | 5/1993 |
| WO | WO 1996/17107 | 6/1996 |
| WO | WO 1996/18756 | 6/1996 |
| WO | WO 1998/51838 | 11/1998 |
| WO | WO 1999/37655 | 7/1999 |
| WO | WO 2000/01006 | 1/2000 |
| WO | WO 2000/03420 | 1/2000 |
| WO | WO 2000/04704 | 1/2000 |
| WO | WO 2000/40772 | 7/2000 |
| WO | WO 2000/47404 | 8/2000 |
| WO | WO 2000/47796 | 8/2000 |
| WO | WO 2000/54320 | 9/2000 |
| WO | WO 2000/55895 | 9/2000 |
| WO | WO 2000/63957 | 10/2000 |
| WO | WO 2001/27347 | 4/2001 |
| WO | WO 2001/29280 | 4/2001 |
| WO | WO 2001/29891 | 4/2001 |
| WO | WO 2001/29893 | 4/2001 |
| WO | WO 2001/53565 | 7/2001 |
| WO | WO 2001/66832 | 9/2001 |
| WO | WO 2001/78123 | 10/2001 |
| WO | WO 2001/78213 | 10/2001 |
| WO | WO 2001/88972 | 11/2001 |
| WO | WO 2004/077515 | 9/2004 |
| WO | WO 2006/080782 | 8/2006 |
| WO | WO 2007/041089 | 4/2007 |
| WO | WO 2008/137399 | 11/2008 |

OTHER PUBLICATIONS

Cole ("Novel tunable acceptor doped BST thin films for high quality tunable microwave devices", Cole et al, Revista Mexicana De Fisica 50 (3) 232-238, Jun. 2004) (Year: 2004).*
1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[Anon], Sep. 19, 2005.
Aaltonen et al., "Atomic Layer Deposition of Noble Metal Thin Films," dissertation presented at the University of Helsinki, Helsinki, Finland, 2005.
Aaltonen et al., "Atomic Layer Deposition of Platinum Thin Films," Chem. Mater. 15: 1924-1928 (2003).
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., "Damascene copper electroplating for chip", IBM Jour. Research and Dev., 1998, vol. 42, Issue 5, pp. 567-574.
Bain et al., "Deposition of tungsten by plasma enhanced chemical vapour deposition", J. Phys. IV France, 1999, vol. 9, pp. 827-833.
Baliga, J., "New Designs and Materials Tackle 1 GB Memory Challenge," Semiconductor International, World Wide Web address: semiconductor.net, Nov. 2000.
Basceri, "Electrical Dielectric Properties of (Ba,Sr) TiO₃ Thin Film Capacitors for Ultra-High Density Dynamic Random Access Memories", Thesis, 1997.
Boukhalfa et al., "Atomic layer deposition of vanadium oxide on carbon nanotubes for high-power supercapacitor electrodes", Energy Environ. Sci., 2012, 5, pp. 6872-6879.
Chang et al., "Chemical Vapor Deposition of Tantalum Carbide and Carbonitride Thin Films from Me3CE=Ta(CH2CMe3)3 (E=CH, N)," J. Mater. Chem. 13:365-369 (2003).
Elers et al., "NbCl5 as a precursor in atomic layer epitaxy", Applied Surface Science, Jul. 9, 1994, vol. 82/83, pp. 468-474.
Favis et al., "Atomic layer epitaxy of silicon, silicon/germanium and silicon carbide via extraction/exchange processes", Avail. NTIS. Report, 1991, pp. 33.

File History of U.S. Appl. No. 10/049,125, filed Aug. 20, 2002.
File History of U.S. Appl. No. 10/242,368, filed Sep. 12, 2002.
File History of U.S. Appl. No. 10/969,297, filed Oct. 19, 2004.
File History of U.S. Appl. No. 11/286,203, filed Nov. 22, 2005.
File History of U.S. Appl. No. 11/288,872, filed Nov. 28, 2005.
File History of U.S. Appl. No. 11/591,845, filed Nov. 1, 2006.
File History of U.S. Appl. No. 11/414,510, filed Apr. 28, 2006.
Fuyuki et al., "Atomic layer epitaxy controlled by surface superstructures in silicon carbide", Thin Solid Films, 1993, vol. 225, Issue 1-2, pp. 225-229.
Fuyuki et al., "Atomic layer epitaxy of cubic silicon carbide by gas source MBE using surface superstructure", J. Cryst. Growth, 1989, vol. 95, Issue 1-4, pp. 461-463.
Girolami et al., "Tailored Organometallics as Low-Temperature CVD Precursors to Thin Films", Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Han et al., "Low temperature synthesis of carbon nanotubes by thermal chemical vapor deposition using co-catalyst", Journal of the Korean Physical Society, vol. 39:S116-S119 (2001).
Han et al., "A mechanochemical model of growth termination in vertical carbon nanotube forests", ACSNANO, vol. 2(1):53-60 (2008).
Hara et al., "Atomic layer control of .beta.-silicon carbide (001) surface", Springer Proc. Phys., 1992, pp. 90-95.
Haukka et al., "Chemisorption of Chromium Acetylacetonate on Porous High Surface Area Silica," Appl. Surface Science 75:220-227 (1994).
Haukka et al., "The Reaction of Hexamethyldisilazane and Subsequent Oxidation of Trimethylsilyl Groups on Silica Studied by Solid-State NMR and FTIR," J. Phys. Chem. 98:1695-1703 (1994).
Hiltunen et al., "Nitrides of titanium, niobium, tantalum and molybdenum grown as thin films by the atomic layer epitaxy method", Thin Solid Films, 1988, vol. 166, pp. 149-154.
Hong et al., "Atomic layer deposition encapsulated activated carbon electrodes for high voltage stable supercapacitors", ACS Appl. Mater. Interfaces vol. 7:1899-1906, (2015).
Hultman et al., "Review of the Thermal and Mechanical Stability of TiN-based Thin Films", Zeitscrift Fur Metallkunde 90 (10): 803-813 (1999).
Ihanus et al., "ALE growth of ZnS1-xSex thin films by substituting surface sulfur with elemental selenium," Appl. Surface Sci., 112:154-158 (1997).
International Search Report and Written Opinion dated Apr. 7, 2008, Application No. PCT/US2007/082131.
Jehn et al., "Gmelin Handbook of Inorganic and Organometallic Chemistry", 8th Edition, 1993, vol. A 5b, Issue 54, pp. 131-154.
Jeon et al., "A Study on the Characteristics of TiN Thin Film Deposited by Atomic Layer Chemical Vapor Deposition Method", J. Vac .Sci. Technol. A, 2000, vol. 18, Issue 4, pp. 1595-1598.
Juppo et al., "Deposition of copper films by an alternate supply of CuCl and Zn", J. Vac. Sci. Technol A, Jul./Aug. 1997, vol. 15, Issue 4, pp. 2330-2333.
Kanzow et al., "Formation mechanism of single-wall carbon nanotubes on liquid-metal particles", Physical Review B, vol. 60(15):11180-11186 (1999).
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., "Atomic-layer-deposited WNxCy thin films as diffusion barrier for copper metallization", Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.

(56) References Cited

OTHER PUBLICATIONS

Klaus et al., "Atomic Layer Deposition of Tungsten Nitride Films Using Sequential Surface Reactions", Journal of the Electrochemical Society, 2000, vol. 147, Issue 3, pp. 1175-1181.
Klaus et al., "Atomic layer deposition of tungsten and tungsten nitride using sequential surface reactions", AVS 46th International Symposium, 1999, Seattle, WA, US.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
Klug et al. "Atomic Layer Deposition of Amorphous Niobium Carbide-Based Thin Film Superconductors". Journal of Physical Chemistry C, 2011, 115, 25063-25071.
Kukli et al., "Properties of (Nb1-xTax)2O5 Solid Solutions and (Nb1-xTax)2O5-ZrO2 Nanolaminates Growth by Atomic Layer Epitaxy", NanoStructured Materials, 1997, vol. 8, pp. 785-793.
Kuznetsov et al., "Thermodynamic analysis of nucleation of carbon deposits on metal particles and its implications for the growth of carbon nanotubes", Physical Review B, vol. 64(235401):1-7 (2001).
Kwon et al., "Ruthenium Bottom Electrode Prepared by Electroplating for a High Density DRAM Capacitor," J. Electrochem. Soc. 151(2): C127-C132 (2004).
Lai et al., "Precursors for Organometallic Chemical Vapor Deposition of Tungsten Carbide Films", Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Lee et al., "Metal Electrode/High-k Dielectric Gate-Stack Technology for Power Management", IEEE Transactions on Electron Devices, vol. 55, No. 1, Jan. 2008, pp. 8-20.
Lee et al., "Atomic layer deposition of $ZrO_2$ on W for metal-indulator-metal capacitor application", Appl. Phys. Lett. vol. 82(17):2874-2876 (2003).
Lee et al., "Compatibility of dual metal gate electrodes with High-K dielectrics for CMOS", Department of Electrical and Computer Engineering, North Carolina State University, IEDM 03-323, 13.5.1-13.5.4 (2003).
Leskelä et al., "ALD precursor chemistry: Evolution and future challenges", Jour. Phys. IV France 9, 1999, pp. 837-852.
Liu et al., "Metal Nanocrystal Memories—Part I: Device Design and Fabrication," IEEE Transactions on Electron Devices 49(9): 1606-1613 (2002).
Liu et al., "Metal Nanocrystal Memories—Part II: Electrical Characteristics," IEEE Transactions on Electron Devices 49(9): 1614-1622 (2002).
Ludviksson et al., "Low-Temperature Thermal CVD of Ti—Al Metal Films Using a Strong Reducing Agent", Chem. Vap. Deposition, 1998, vol. 4, Issue 4, pp. 129-132.
Martensson, "Use of atomic layer epitaxy for fabrication of Si/TiN/Cu structures", J. Vac. Sci. Technol. B, Sep./Oct. 1999, vol. 17, Issue 5, pp. 2122-2128.
Martensson et al., "Atomic Layer Epitaxy of Copper and Tantalum", Chemical Vapor Deposition, 1997, vol. 3, Issue 1, pp. 45-50.
Martensson et al., "CU(THD)2 as Copper Source in Atomic Layer Epitaxy", Electrochemical Society Proceedings, vol. 97-25, (1997) pp. 1529-1536.
Matsunami et al., "Hetero-interface control and atomic layer epitaxy of SiC", Applied Surface Science, 1997, vol. 112, pp. 171-175.
Min et al., "Atomic Layer Deposition of TiN Films by Alternate Supply of Tetrakis (ethylmethylamino)-Titanium and Ammonia", Jpn. J. Appl. Phys., 1998, vol. 37, pp. 4999-5004.
Min et al., "Atomic Layer Deposition of TiN Thin Films by Sequential Introduction of Ti Precursor and HN3", Mat. Res. Soc. Symp. Proc., 1998, vol. 514, pp. 337-342.

Moon et al., "The work function behavior of aluminum-doped titanium carbide grown by atomic layer deposition", IEEE Transactions on Electron Devices, vol. 63(4):1423-1427, (2016).
Nagatsu et al., "Narrow multi-walled carbon nanotubes produced by chemical vapor deposition using graphene layer encapsulated catalytic metal particles", Carbon 44:3336-3341 (2006).
Nakajima et al., "Chemical Vapor Deposition of Tungsten Carbide, Molybdenum Carbide Nitride, and Molybdenum Nitride Films", J. Electrochem. Soc., Jun. 1997, vol. 144, Issue 6, pp. 2096-2100.
Nasibulin et al. "An essential role of CO2 and H2O during single-walled CNT synthesis from carbon monoxide" Chemical Physics letters 417 (2006) 179-184.
Ovanesyan et al., "Challenges in atomic layer deposition of carbon-containing silicon-based dielectrics", Jornal of Vacuum Science & Technology A 35(2):1-7, (2017), https://doi.org/10.1116/1.4973923.
Oviroh et al., "New development of atomic layer deposition: processes, methods and applications", Science and Technology of Advanced Materials, vol. 20(1):465-496, (2019).
Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.
Polyakov et al., "Growth of GaBN Ternary Solutions by Organometallic Vapor Phase Epitaxy", Journal of Electronic Materials, vol. 26(3):237-242 (1997).
Ren et al. "Low temperature carbon nanotube growth on Ni—CaF2 coated sodalime glass substrate using thermal CVD method" Vacuum Electron Sources Conference (2004), p. 159-162.
Ritala et al., "Atomic layer epitaxy growth of TiN thin films", J. Electrochem. Soc., 1995, vol. 142, Issue 8, pp. 2731-2737.
Ritala et al., "Atomic Layer Epitaxy Growth of TiN Thin Films from TiI4 and NH3", J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., "Effects of intermediate zinc pulses on properties of TiN and NbN films deposited by atomic layer epitaxy", Appl. Surf. Sci., 1997, vol. 120, pp. 199-212.
Ritala et al., "Perfectly conformal TiN and Al2O3 films deposited by atomic layer deposition", Chem. Vapor Deposition, 1999, vol. 5, pp. 7-9.
Ritala et al., "Surface roughness reduction in atomic layer epitaxy grown of titanium dioxide thin films," Thin Solid Films, vol. 249, pp. 155-162 (1994).
Rodriguez-Manzo et al., "Growth of single-walled carbon nanotubes from sharp metal tips", Small vol. 5(23):2710-2715 (2009).
Sadayuki et al., "Sub-atomic layer growth of SiC at low temperatures", Japanese Journal of Applied Physics, 1995, vol. 34, Issue 11, pp. 6166-6170.
Senzaki et al., "Atomic Layer Deposition of High k Dielectric and Metal Gate Stacks for MOS Devices", CP 788, Characterization and Metrology for ULSI Technology 2005, edited by Seiler et al., pp. 69-72.
Sherman et al., "Plasma enhanced atomic layer deposition of Ta for diffusion barrier applications", AVS 46th International Symposium, Oct. 26, 1999, Seattle, WA, US.
SOI Technology: IMB's Next Advance in Chip Design, 1998.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Thin Films and Epitaxy", Handbook of Crystal Growth 3, Part B: Growth Mechanisms and Dynamics, Chapter 14, pp. 602-662, (1994).
Tulhoff et al., Ullmann's Encyclopedia of Industrial Chemistry, 5th, Completely Revised Edition, 1986, vol. A5, pp. 61-77.
Tuyen et al., "Hydrogen termination for the growth of carbon nanotubes on silicon", Chemical Physic Letters vol. 415:333-336 (2005).

(56) References Cited

OTHER PUBLICATIONS

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wong et al., "Barriers for copper interconnections", Solid State Technology, 1999, pp. 1-7.

Yang et al., "Atomic Layer Deposition of Tungsten Film from WF6/B2H6: Nucleation Layer for Advanced Semiconductor Devices", Advanced Metallization Conference 2001 (AMC 2001), Conference Proceedings ULSI XVII@2002 Materials Research Soceety, 2001, pp. 655-660.

Zhang et al., "High permittivity thin film nanolaminates," Journal of Applied Physics, vol. 87, No. 4, pp. 1921-1924 (2000).

\* cited by examiner

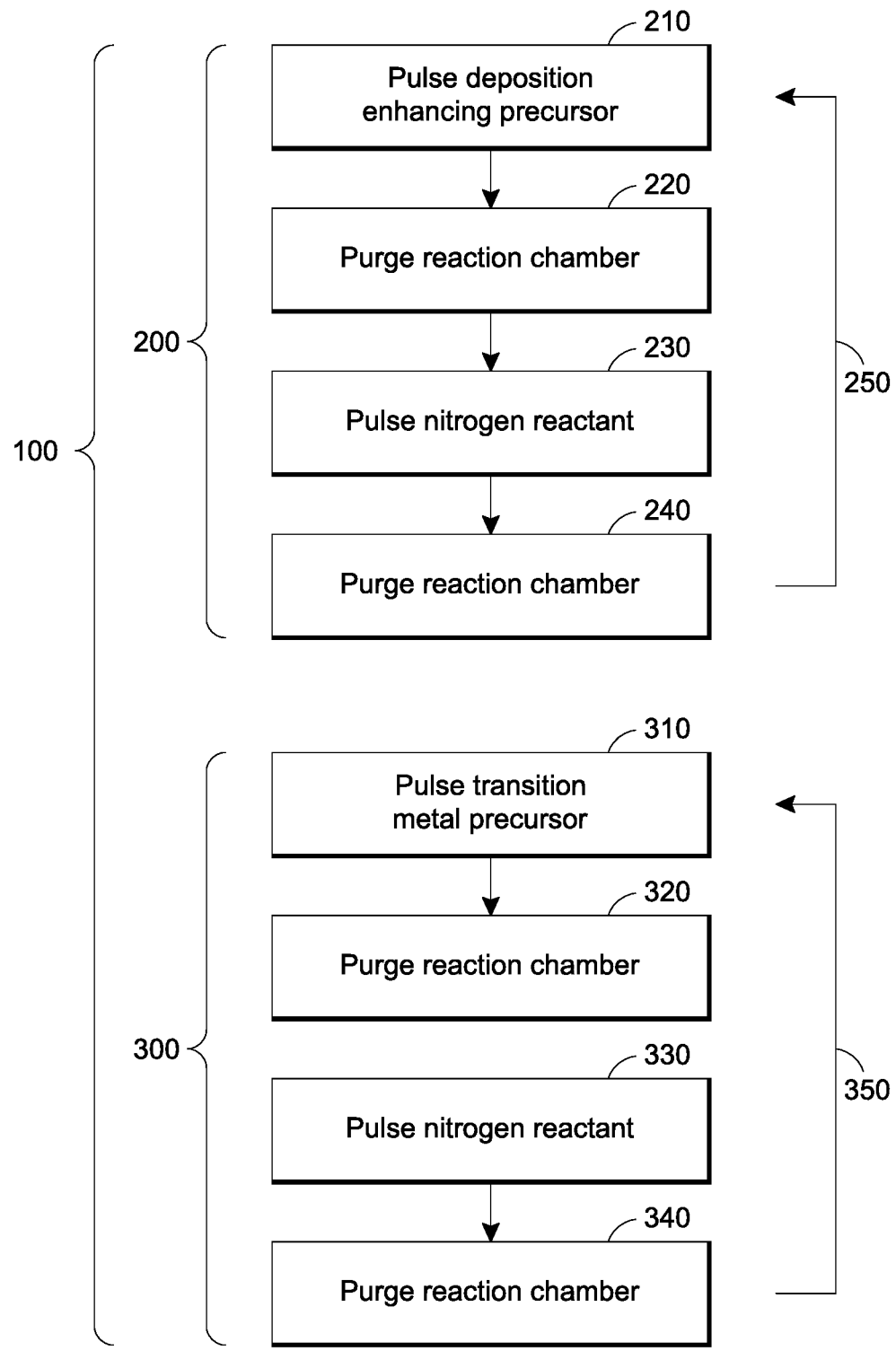

DEPOSITION OF OXIDES AND NITRIDES

REFERENCE TO RELATED APPLICATION

This application claims priority to U.S. Provisional application No. 62/805,634, filed Feb. 14, 2019, which is incorporated by reference herein.

FIELD OF THE INVENTION

The present application relates generally to processes for depositing thin films on a substrate by vapor deposition, including metal oxides, metal nitrides, silicon oxide and silicon nitride.

BACKGROUND

Oxide and nitride films find a wide variety of uses in the semiconductor industry. For example, titanium nitride (TiN) is one of the most widely used materials in the CMOS industry and as such is deposited for many purposes (e.g., liner, hard mask, metal gate, etc.). Therefore, the material requirements for TiN layer are typically defined by the application and a wide variety of deposition methods are used in the industry, including, for example, physical vapor deposition (PVD), chemical vapor deposition (CVD) and atomic layer deposition (ALD). ALD of TiN has been carried out with $TiCl_4$ and $NH_3$ precursors and is used, for example, in metal gate fabrication and in the deposition of liner material for high aspect ratio structures requiring conformal coating (e.g., VNAND structures). However, the typical growth per cycle (GPC) of ALD TiN processes is relatively slow.

SUMMARY

In some aspects, vapor deposition processes for forming oxide or nitride thin films are provided. In some embodiments atomic layer deposition (ALD) methods for forming transition metal oxide or transition metal nitride thing films are provided. The ALD methods may comprise at least one deposition cycle that includes a first sub-cycle and a second sub-cycle. In some embodiments the first sub-cycle comprises alternately and sequentially contacting the substrate with a deposition enhancing precursor comprising a Group II metal and an oxygen or nitrogen reactant. The second sub-cycle may comprise alternately and sequentially contacting the s substrate with a transition metal precursor and an oxygen or nitrogen reactant. In some embodiments the first sub-cycle is repeated from 1 to 10 times in succession in the deposition cycle. In some embodiments the second sub-cycle is repeated from 1 to 10 times in succession in the deposition cycle. In some embodiments the first and second sub-cycles are repeated from 1 to 10 times in succession in each deposition cycle. The deposition temperature is from about 300 to 600° C. in some embodiments.

In some embodiments the deposition enhancing precursor comprise a metalorganic, organometallic, alkyl or cyclic compound. In some embodiments the deposition enhancing precursor comprises Mg, Sr, Ba or Ca. For example, a deposition enhancing precursor may comprise $MgCp_2$.

In some embodiments the transition metal precursor comprises a transition metal halide. In some embodiments the transition metal in the transition metal precursor may be, for example, Ti, Ta, Nb, W, Mo, Zr, Hf or V.

In some embodiments an ALD process forms a transition metal oxide and the first sub-cycle comprises alternately and sequentially contacting the substrate with a deposition enhancing precursor and an oxygen reactant and the second sub-cycle comprises contacting the substrate with a transition metal precursor and an oxygen reactant. The oxygen reactant may comprise, for example, $O_2$, $H_2O$, $O_3$, oxygen atoms, oxygen radicals or oxygen plasma.

In some embodiments an ALD process forms a transition metal nitride and the first sub-cycle comprises alternately and sequentially contacting the substrate with a deposition enhancing precursor and a nitride reactant and the second sub-cycle comprises alternately and sequentially contacting the substrate with a transition metal precursor and a nitrogen reactant. In some embodiments the nitrogen reactant is a nitride reactant. In some embodiments the nitrogen reactant comprises $N_2$, $NO_2$, $NH_3$, $N_2H_4$, $N_2H_2$, nitrogen atoms, nitrogen radicals or nitrogen plasma.

In some embodiments an ALD deposition process has a growth rate per deposition cycle that is at least 1.5 times greater than the growth rate per deposition cycle of a process in which a sub-cycle comprising the use of deposition enhancing agent is not included. For example, in some embodiments an ALD deposition process has a growth rate per deposition cycle that is at least 1.5 times greater than the growth rate per deposition cycle of a process in which the substrate is alternately and sequentially contacted with the same transition metal precursor and the same oxygen or nitrogen reactant.

In some embodiments ALD processes for forming a TiN thin film are provided. The processes may comprise a plurality of deposition cycles in which at least one deposition cycle comprises a first sub-cycle which the substrate is alternately and sequentially contacted with a deposition enhancing precursor comprising $MgCp_2$ and a nitrogen reactant and a second sub-cycle in which the substrate is alternately and sequentially contacted with a titanium halide, such as $TiCl_4$, and a nitrogen reactant, such as $NH_3$. In some embodiments at least two or more deposition cycles comprise first and second such sub-cycles.

In some embodiments thermal atomic layer deposition processes are provided for depositing silicon oxide or silicon nitride thin films. One, two or more deposition cycles comprise a first sub-cycle in which the substrate separately contacted with a deposition enhancing precursor comprising a Group II metal and an oxygen or nitrogen reactant, and a second sub-cycle in which the substrate is separately contacted with a silicon halide precursor and an oxygen or nitrogen reactant.

In some embodiments $SiO_2$ is deposited and the first sub-cycle comprises alternately and sequentially contacting the substrate with a deposition enhancing precursor and an oxygen reactant and the second sub-cycle comprising alternately and sequentially contacting the substrate with a silicon halide and an oxygen reactant. In some embodiments the oxygen reactant is different in the first sub-cycle and second sub-cycle. In some embodiments the oxygen reactant is the same in the first sub-cycle and second sub-cycle.

In some embodiments SiN is deposited and the first sub-cycle comprises alternately and sequentially contacting the substrate with a deposition enhancing precursor and a nitrogen reactant and the second sub-cycle comprising alternately and sequentially contacting the substrate with a silicon halide and a nitrogen reactant. In some embodiments the nitrogen reactant is different in the first sub-cycle and second sub-cycle. In some embodiments the nitrogen reactant is the same in the first sub-cycle and second sub-cycle.

BRIEF DESCRIPTION OF THE DRAWINGS

The present disclosure will be better understood from the Detailed Description and from the appended drawing, which is meant to illustrate and not to limit the invention, and wherein:

FIG. 1 is a flow-chart illustrating a process for depositing a transition metal nitride by an ALD deposition cycle including a deposition enhancing sub-cycle and a metal nitride deposition sub-cycle.

DETAILED DESCRIPTION

Vapor deposition processes, such as atomic layer deposition (ALD) processes, employing a deposition enhancing precursor can be used to form a variety of oxide and nitride films, including metal oxide, metal nitride, metal oxynitride, silicon oxide and silicon nitride films. For example, the methods disclosed herein can be used to deposit transition metal nitrides, such as TiN, transition metal oxides, and silicon oxides and nitrides, such as $SiO_2$ and SiN. In some embodiments the deposition processes are thermal processes and no plasma reactants are utilized in the deposition process. In some embodiments the deposition processes are plasma enhanced processes and one or more plasma reactants is utilized.

In some embodiments the methods advantageously enable improved thin film formation, for example by providing increased deposition rates. Due to the increased deposition rate, fewer deposition cycles may be required to achieve the desired films. In some embodiments the processes can provide increased throughput and/or reduced precursor utilization in the deposition of oxides, nitride or oxynitrides, such as metal oxides, metal nitrides, silicon oxide or silicon nitride. In some embodiments a deposition enhancing precursor is introduced in one or more deposition cycles. For example, a deposition enhancing precursor may be introduced in one, two, three, four or more deposition cycles. In some embodiments a deposition enhancing precursor is introduced into a deposition cycle at intervals in a deposition process. As discussed in more detail below, in some embodiments the deposition enhancing precursor is introduced into a deposition process through a sub-cycle in which the substrate is contacted with the deposition enhancing precursor and an oxygen or nitrogen reactant.

In some embodiments in a deposition process utilizing a deposition enhancing precursor the growth rate of the film, for example as measured by growth per cycle (GPC), is at least about 1.5 times higher than the growth rate obtained in a corresponding deposition process that does not utilize a deposition enhancing precursor (or "catalyst"), at least about 2.0 times greater than without the deposition enhancing precursor, at least about 2.5 times greater than without the deposition enhancing precursor, at least about 3 times greater than without the deposition enhancing precursor, at least about 3.5 times greater than without the deposition enhancing precursor, or at least about 4 times greater than without the deposition enhancing precursor. GPC may be calculated by dividing the film thickness by the number of the total cycles that are repeated in the process.

As discussed in more detail below, in some embodiments the deposition enhancing precursors, also referred to as "catalysts" due to their ability to enhance the growth rate in some embodiments, are Group II metal precursors. That is, in some embodiments a deposition enhancing precursor comprises a Group II metal. The deposition enhancing precursors may be, for example, metalorganic, organometallic, alkyl and cyclic compounds. The compounds may be saturated or unsaturated, substituted or unsubstituted. In some embodiments the deposition enhancing precursors comprise one or more cyclopentadienyl (Cp) ligands. In some embodiments the deposition enhancing precursors comprise Mg, Sr, Ba or Ca. In some embodiments a deposition enhancing precursor is $MgCp_2$.

In some embodiments the deposition processes are used to deposit metal nitrides, metal oxides or metal oxynitrides. In some embodiments the deposition processes are used to deposit transition metal nitrides, transition metal oxides or transition metal oxynitrides. In some embodiments the deposition processes are used to deposit silicon oxides, silicon nitrides or silicon oxynitrides. Thus, the deposition processes utilize one or more precursors comprising a metal, such as a transition metal, or silicon. The precursors that contribute metal or silicon to the oxide, nitride or oxynitride film may be, for example, metal halides, such as transition metal halides, or silicon halides. In some embodiments the precursors comprise one or more of Ti, Ta, Nb, W, Mo, Zr, Hf, V or Si. In some embodiments the precursors are halide compounds that comprise one or more of Br, I, Cl or F in addition to a metal or silicon. In some embodiments the precursor is a metal or silicon chloride.

In some embodiments metal nitrides or oxynitrides or silicon nitrides or oxynitrides are deposited using one or more nitrogen precursors, as discussed in more detail below. In some embodiments the nitrogen precursors that can be used to form nitrides or oxynitrides may include, for example, $N_2$, $NO_2$, $NH_3$, $N_2H_4$, or $N_2H_2$ and/or other nitrogen containing compounds. In some embodiments the nitrogen precursor may comprise a reactive species, such as nitrogen atoms, nitrogen ions, nitrogen radicals, or nitrogen plasma.

In some embodiments a thermal ALD cycle is used and a nitrogen precursor does not comprise reactive species generated by a plasma. In some embodiments a plasma ALD process is used and a nitrogen precursor is utilized that comprises nitrogen atoms, nitrogen-containing plasma, or nitrogen radicals.

In some embodiments metal oxides or oxynitrides or silicon oxides or oxynitrides are deposited using one or more oxygen precursors, as discussed in more detail below. The oxygen precursors that can be used to form the oxides or oxynitrides may comprise, for example, $O_2$, $H_2O$, $O_3$, and/or other oxygen-containing compounds. In some embodiments an oxygen precursor may comprise a reactive oxygen species, such as oxygen atoms, oxygen radicals, or oxygen plasma.

In some embodiments a thermal ALD cycle is used and an oxygen precursor does not comprise reactive species generated by a plasma. For example, in some embodiments thermal processes are used to deposit silicon oxide or silicon nitride films, such as $SiO_2$ or SiN. In some embodiments a plasma ALD process is used and an oxygen precursor is utilized that comprises oxygen atoms, oxygen-containing plasma, or oxygen radicals.

In some embodiments the deposition processes are thermal processes and plasma reactants are not utilized at any point in the deposition process. In some embodiments the deposition processes are plasma processes and one or more plasma reactants is used in one or more deposition cycles.

As discussed in more detail below, in some embodiments a deposition process may comprise one or more deposition cycles in which a substrate in a reaction space is contacted with a first metal or silicon precursor, an oxygen or nitrogen precursor an da deposition enhancing precursor. In some embodiments a deposition process comprises one or more cycles in which a substrate is alternately contacted with a deposition enhancing precursor, a metal or silicon precursor and one or more oxygen or nitrogen reactants.

In some embodiments a deposition process comprises at least one deposition cycle comprising a first sub-cycle in which the substrate is alternately and sequentially contacted with a first metal or silicon precursor and an oxygen and/or nitrogen precursor and one or more second sub-cycles in which the substrate is alternately and sequentially contacted with a deposition enhancing precursor and an oxygen and/or nitrogen precursor. In some embodiments the oxygen or nitrogen precursors used in the first and second sub-cycles are the same. In some embodiments different oxygen and/or nitrogen precursors are used in the first and second sub-cycles. Although referred to as the first and second sub-cycles in some embodiments the second sub-cycle may be conducted before the first sub-cycle in one or more deposition cycles.

In some embodiments a deposition process comprises, two, three, four, five, ten, twenty-five, fifty, one hundred or more such deposition cycles. In some embodiments the first sub-cycle utilizing the deposition enhancing precursor is provided in at least one deposition cycle in a deposition process. In some embodiments the first sub-cycle utilizing the deposition enhancing precursor is provided in two or more deposition cycles in a deposition process. In some embodiments deposition cycles utilizing a first and second sub-cycle are provided at intervals in a deposition process. That is, in some embodiments a deposition process includes one or more deposition cycles that include both the first and second sub-cycles and one or more deposition cycles that include only the second sub-cycles (and not the deposition enhancing precursor).

In some embodiments the first sub-cycle may be repeated two or more times sequentially in a deposition cycle. In some embodiments the second sub-cycle may be repeated two or more times sequentially in a deposition cycle. In some embodiments both the first and second sub-cycles are repeated two or more times sequentially in a deposition cycle.

In some embodiments the metal oxide, metal nitride, metal oxynitride, silicon oxide, silicon nitride or silicon oxynitride deposition process may comprise one or more cycles in which the substrate is contacted with the deposition enhancing agent, a metal or silicon reactant such as a transition metal halide or silicon halide and a nitrogen or oxygen reactant. For example, in some embodiments TiN deposition by ALD from $TiCl_4$ and $NH_3$ is enhanced by introducing a deposition enhancing precursor, such as $MgCp_2$, into the deposition process. In some embodiments the TiN deposition process may comprise one or more cycles in which the substrate is contacted with a deposition enhancing agent, such as $MgCp_2$, a titanium reactant such as a titanium halide and a nitrogen reactant. In some embodiments a TiN ALD process comprises a deposition cycle comprising one or more first sub-cyclse comprising alternately and sequentially contacting a substrate with $TiCl_4$ and $NH_3$ and one or more second sub-cycles in which the substrate is alternately and sequentially contacted with $MgCp_2$ and $NH_3$. In some embodiments growth per cycle of the film being deposited, such as the TiN film, is increased about three-fold when a deposition enhancing precursor such as $MgCp_2$ is utilized.

Atomic Layer Deposition (ALD)

ALD type processes are based on controlled, surface reactions of precursor chemicals. In some embodiments the surface reactions are generally self-limiting. Gas phase reactions are avoided by contacting the substrate separately with each reactant. In some embodiments this may be accomplished by feeding the precursors separately into the reaction space to contact the substrate. In some embodiments the reactants are alternately and sequentially pulsed into the reaction chamber. Vapor phase reactants are separated from each other in the reaction chamber, for example, by removing excess reactants and/or reactant by-products from the reaction chamber between reactant pulses. In some embodiments a substrate may be separately contacted with each reactant by moving the substrate to a reaction space that comprises each reactant individually.

Briefly, in some embodiments a substrate is loaded into a reaction chamber and is heated to a suitable deposition temperature, generally at lowered pressure. In some embodiments the substrate comprises a 300 mm silicon wafer. In some embodiments the substrate comprises a 450 mm wafer. Deposition temperatures are typically maintained below the precursor thermal decomposition temperature but at a high enough level to avoid condensation of reactants and to provide the activation energy for the desired surface reactions. In some embodiments the deposition temperature is about 300 to 600° C.

Each reactant may be conducted or pulsed into the chamber in the form of vapor phase pulse and contacted with the surface of a substrate. Excess reactant and reaction byproducts, if any, may be "purged" or removed from the reaction chamber, such as with a pulse of inert gas such as nitrogen or argon. Excess vapor phase precursors and/or vapor phase reaction byproducts can be removed from the reaction chamber, for example, by evacuating the chamber with a vacuum pump and/or by replacing the gas inside the reactor by purging with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing and purging times can be readily determined by the skilled artisan based on the particular circumstances.

The precursors employed in the processes may be solid, liquid, or gaseous material under standard conditions (room temperature and atmospheric pressure), provided that they are in vapor phase before they are conducted into the reaction chamber and contacted with the substrate surface.

An excess of reactant precursors is typically supplied in each phase to saturate the susceptible structure surfaces. Surface saturation ensures reactant occupation of essentially all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space can provide increased self-limiting behavior and thus maximum conformality, but steric hindrance results in less than one molecular layer per cycle.

"Pulsing" a vaporized reactant onto the substrate means that the vapor is conducted into the chamber for a limited period of time such that the substrate is exposed to the reactant. Typically, the pulsing time is from about 0.05 seconds to about 10 seconds. However, depending on the substrate type and its surface area, the pulsing time may be even higher than about 10 seconds.

As an example, for a 300 mm wafer in a single wafer ALD reactor, the reactants are typically pulsed for from about 0.05 seconds to about 10 seconds, more preferably for from about 0.1 seconds to about 5 seconds and most preferably for from about 0.3 seconds to about 3.0 seconds. However, pulsing times can be on the order of minutes in some cases. The optimum pulsing time can be readily determined by the skilled artisan based on the particular circumstances.

The mass flow rate of the reactants can be determined by the skilled artisan. In some embodiments, for example for deposition on 300 mm wafers, the flow rate of the reactants is preferably between about 1 sccm and about 1000 sccm, about 10 sccm to about 800 sccm, or about 50 sccm to about 500 sccm.

The pulsing time and mass flow rate of each of the reactants can be selected independently. In some embodiments the pulsing time (and/or mass flow rates) of two or more of the reactants is the same, while in some embodiments the pulsing times (or mass flow rates) are different.

The pressure in the reaction chamber is typically from about 0.01 mbar to about 20 mbar, more preferably from about 1 mbar to about 10 mbar. However, in some cases the pressure will be higher or lower than this range, as can be readily determined by the skilled artisan depending on multiple parameters, such as the particular reactor being used, the process and the precursors.

Before starting the deposition of the film, the substrate may be heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

In some embodiments the deposition temperature is about 200° C. to about 800° C., about 250° C. to about 750° C., about 275° C. to about 650° C., about 300° C. to about 600° C., about 325° C. to about 550° C., or about 350° C. to about 525° C. In some embodiments, the first and second sub-cycles are performed at same reaction temperature.

The processing time depends, in part, on the thickness of the layer to be produced, the composition of the film, and the overall growth rate.

In some embodiments the reactor in which deposition is carried out is a batch reactor, such as a vertical batch reactor. In some embodiments, deposition is carried out in a furnace batch reactor, such as a vertical furnace batch reactor. In some embodiments the reactor in which deposition is carried out is a batch reactor capable of holding more than about 50 substrates, more than about 100 substrates, or more than about 125 substrates. In some embodiments the reactor is a mini-batch reactor and has from 2 to about 20 substrates, from 3 to about 15 substrates, or from 4 to about 10 substrates. In some embodiments, the substrate is a silicon wafer, such as a silicon wafer having a diameter of at least about 150 mm. In some embodiments the substrate is a silicon wafer having a diameter of at least about 200 mm, or at least about 300 mm. In some embodiments, the substrate could be a silicon wafer having a diameter of at least about 450 mm.

The ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run. In some embodiments, the first and second sub-cycles are performed in the same reactor. In some embodiments, the first and second sub-cycles are performed in the same reaction space.

In another aspect, semiconductor device structures are provided that comprise one or more oxide, nitride or oxynitride films. The structures comprise a substrate and a thin film layer overlying the substrate, wherein the thin film layer is formed by an atomic layer deposition (ALD) process as described herein.

Oxide and Nitride Film Deposition

According to some embodiments, a deposition enhancing precursor (which can also be referred to as a "catalyst") is utilized in ALD processes for depositing an oxide, nitride or oxynitride film. In some embodiments the deposition enhancing precursor is provided one or more times in an ALD deposition cycle. In some embodiments the deposition enhancing precursor is provided in a sub-cycle in which the substrate is contacted with the deposition enhancing precursor and a second reactant, such as an oxygen and/or nitrogen reactant. In some embodiments in a deposition enhancing sub-cycle the substrate is alternately and sequentially contacted with a deposition enhancing precursor and with a second reactant such as a nitrogen or oxygen source.

In some embodiments the film that is deposited comprises a metal oxide or metal nitride. For example, in some embodiments a transition metal oxide or transition metal nitride is deposited. In some embodiments silicon oxide or silicon nitride is deposited. In some embodiments silicon oxide or silicon nitride or silicon oxynitride is deposited by thermal processes that do not utilize plasma reactants. In some embodiments a metal oxynitride or silicon oxynitride is deposited.

As discussed above, in some embodiments the thin film is deposited utilizing a halide-containing metal or silicon precursor. In some embodiments the precursor comprise one or more of Br, I, Cl or F. In some embodiments the halide-containing precursor is a silicon halide precursor, such as $SiCl_4$. In some embodiments the halide-containing precursor is a transition metal halide precursor. In some embodiments the precursors comprise one or more of Ti, Ta, Nb, W, Mo, Zr, Hf, V or Si. In some embodiments the precursor is a metal chloride or silicon chloride.

In some embodiments the deposition enhancing precursor is a metalorganic compound, such as $MgCp_2$. In some embodiments the deposition enhancing precursor is a metalorganic precursor comprising an alkaline earth metal. In some embodiments the deposition enhancing precursor comprises a metalorganic, organometallic, alkyl, or cyclic compound. The compound may be saturated or unsaturated. The compound may be substituted or unsubstituted. In some embodiments the deposition enhancing precursor comprises a compound with one or more cyclopentadienyl ligands. In some embodiments the deposition enhancing precursor comprises a metal selected from Mg, Sr, Ba and Ca. In some embodiments the deposition enhancing precursor is $MgCp_2$.

The deposition enhancing precursor may be provided in each ALD cycle, or at intervals during the deposition process. For example, in some embodiments the deposition enhancing precursor may be provided in a sub-cycle in which the substrate is alternately and sequentially contacted with the deposition enhancing precursor and a nitrogen or oxygen precursor. The sub-cycle may be carried out one or more times in the deposition process, as discussed in more detail below.

In some embodiments the growth rate of the film being deposited is greater than about 0.5 Å/cycle, greater than about 0.6 Å/cycle, greater than about 0.7 Å/cycle, greater than about 0.8 Å/cycle, greater than about 0.9 Å/cycle, greater than about 1.0 Å/cycle, greater than about 1.1 Å/cycle, greater than about 1.2 Å/cycle, or greater than about 1.3 Å/cycle.

In some embodiments, atomic layer deposition (ALD) processes are used to form metal oxide thin films on a substrate. The ALD processes may comprise a deposition cycle including a first sub-cycle and a second sub-cycle. The first sub cycle comprises separately contacting the substrate with a deposition enhancing precursor and an oxygen source. In some embodiments the first sub-cycle comprises contacting the substrate with alternating and sequential pulses of a deposition enhancing precursor and a first reactant comprising an oxygen source. The first sub-cycle may be repeated 1, 2 or more times in at least one deposition cycle. In some embodiments the first sub-cycle is provided 1, 2 or more times in each deposition cycle.

The second sub-cycle comprises contacting the substrate separately with a metal or silicon precursor and a second oxygen source. For example, in some embodiments the second sub-cycle comprises contacting the substrate with alternating and sequential pulses of a metal precursor and a second reactant comprising an oxygen source. The second sub-cycle may be repeated 1, 2 or more times in each deposition cycle. The complete deposition cycle is repeated 1, 2 or more times to deposit a metal oxide of the desired thickness.

In some embodiments the first reactant comprising an oxygen source (used in the first sub-cycle) and the second reactant comprising an oxygen source (used in the second sub-cycle) are the same. In some embodiments the first reactant comprising an oxygen source and the second reactant comprising an oxygen source are different. In some embodiments the first sub-cycle is not carried out in one or more deposition cycles in the deposition process. In some embodiments the first sub-cycle is carried out in one or more deposition cycles and the first sub-cycle is not carried out in one or more different deposition cycles in the same deposition process.

In some embodiments the growth rate per cycle (GPC) of the metal oxide is greater than the GPC of a metal oxide process that does not utilize a deposition enhancing precursor in at least one cycle. In some embodiments the GPC of the metal oxide process may be 2, 3 or more times greater than that of a metal oxide ALD process that does not utilize the deposition enhancing precursor.

In some embodiments of the invention, atomic layer deposition (ALD) processes are used to form metal nitride thin films on a substrate. The processes preferably comprise a deposition cycle including a first sub-cycle and a second sub-cycle. The first sub-cycle comprises separately contacting the substrate with a deposition enhancing precursor and a first reactant comprising a nitrogen source. For example, in some embodiments the first sub-cycle comprises contacting the substrate with alternating and sequential pulses of a deposition enhancing precursor and a first reactant comprising a nitrogen source. The first sub-cycle may be repeated 1, 2 or more times in at least one deposition cycle. In some embodiments the first sub-cycle is provided 1, 2 or more times in each deposition cycle. The second sub-cycle comprises separately contacting the substrate with a metal precursor and a second reactant comprising a nitrogen source. For example, in some embodiments the second sub-cycle comprises contacting the substrate with alternating and sequential pulses of a metal precursor and a second reactant comprising a nitrogen source. The second sub-cycle may be repeated 1, 2 or more times in each deposition cycle. The deposition cycle is repeated 1, 2 or more times to deposit a metal nitride of the desired thickness. In some embodiments the first reactant comprising a nitrogen source and the second reactant comprising a nitrogen source are the same. In some embodiments the first reactant comprising a nitrogen source and the second reactant comprising a nitrogen source are different. In some embodiments the first sub-cycle is not carried out in one or more deposition cycles. In some embodiments the first sub-cycle is carried out in one or more deposition cycles and the first sub-cycle is not carried out in one or more deposition cycles in the deposition process.

In some embodiments the growth rate per cycle (GPC) of the metal nitride is greater than the GPC of a metal nitride process that does not utilize a deposition enhancing precursor in at least one cycle. In some embodiments the GPC of the metal nitride process may be 2, 3 or more times greater than that of a metal nitride ALD process that does not utilize the deposition enhancing precursor.

In some embodiments an oxynitride film may be formed, for example by using a second reactant that includes both an oxygen source and a nitrogen source. The second reactant may be used in both the first and second sub-cycles. In some embodiments the second reactant is the same in both the first and second sub-cycles. In some embodiments a different second reactant is used in the first sub-cycle and second sub-cycle.

In some embodiments of the invention, atomic layer deposition (ALD) processes are used to form a titanium nitride thin film on a substrate. The processes preferably comprise a deposition cycle including a first sub-cycle and a second sub-cycle. The first sub cycle comprises separately contacting the substrate with a deposition enhancing precursor and a first reactant, such as by contacting the substrate with alternating and sequential pulses of a deposition enhancing precursor, such as $MgCp_2$ and a first reactant comprising a nitrogen source, such as $NH_3$. The first sub-cycle may be repeated 1, 2 or more times in at least one deposition cycle. In some embodiments the first sub-cycle is provided 1, 2 or more times in each deposition cycle. In some embodiments the first sub-cycle is not provided in at least one deposition cycle. The second sub-cycle comprises separately contacting the substrate with a titanium precursor and a second nitrogen reactant such as by alternating and sequential pulses of a titanium halide, such as $TiCl_4$ and a second reactant comprising a nitrogen source, such as $NH_3$. The second sub-cycle may be repeated 1, 2 or more times in each deposition cycle. The complete deposition cycle is repeated 1, 2 or more times to deposit titanium nitride of the desired thickness. In some embodiments the first reactant comprising a nitrogen source and the second reactant comprising a nitrogen source are the same. In some embodiments the first reactant comprising a nitrogen source and the second reactant comprising a nitrogen source are different. In some embodiments the growth rate per cycle (GPC) of TiN is greater than the GPC of a TiN process that does not utilize a deposition enhancing precursor. In some embodiments the GPC of the TiN process may be 2, 3 or more times greater than that of a TiN ALD process that does not utilize the deposition enhancing precursor.

In other embodiments, atomic layer deposition (ALD) processes for forming a silicon-containing thin film, such as a silicon nitride or silicon oxide thin film on a substrate are disclosed.

In some embodiments, atomic layer deposition (ALD) processes are used for forming silicon oxide thin films on a substrate. The processes preferably comprise a deposition cycle including a first sub-cycle and a second sub-cycle. The first sub cycle comprises separately contacting the substrate with a deposition enhancing precursor and a an oxygen source, such as by contacting the substrate with alternating and sequential pulses of a deposition enhancing precursor and a first reactant comprising an oxygen source. The first sub-cycle may be repeated 1, 2 or more times in at least one deposition cycle. In some embodiments the first sub-cycle is provided 1, 2 or more times in each deposition cycle. In some embodiments the first sub-cycle is not provided in at least one deposition cycle. The second sub-cycle comprises separately contacting the substrate with a silicon reactant and an oxygen source, such as by contacting the substrate with alternating and sequential pulses of a silicon reactant and a second reactant comprising an oxygen source. The second sub-cycle may be repeated 1, 2 or more times in each deposition cycle. The complete deposition cycle is repeated 1, 2 or more times to deposit a metal oxide of the desired thickness. In some embodiments the first reactant comprising an oxygen source and the second reactant comprising an oxygen source are the same. In some embodiments the first reactant comprising an oxygen source and the second reactant comprising an oxygen source are different.

In some embodiments the growth rate per cycle (GPC) of the silicon oxide is greater than the GPC of a silicon oxide process that does not utilize a deposition enhancing precursor in at least one cycle. In some embodiments the GPC of the silicon oxide process may be 2, 3 or more times greater than that of a silicon oxide ALD process that does not utilize the deposition enhancing precursor.

In some embodiments, atomic layer deposition (ALD) processes are used for forming silicon nitride thin films on a substrate. The processes preferably comprise a deposition cycle including a first sub-cycle and a second sub-cycle. The first sub cycle comprises separately contacting the substrate with a deposition enhancing precursor and a nitrogen reactant, such as by contacting the substrate with alternating and sequential pulses of a deposition enhancing precursor and a first reactant comprising a nitrogen source. The first sub-cycle may be repeated 1, 2 or more times in at least one deposition cycle. In some embodiments the first sub-cycle is provided 1, 2 or more times in each deposition cycle. In some embodiments the first sub-cycle is not provided in at least one deposition cycle. The second sub-cycle comprises separately contacting the substrate with a silicon precursor and a nitrogen reactant such as by contacting substrate with alternating and sequential pulses of a silicon precursor and a second reactant comprising a nitrogen source. The second sub-cycle may be repeated 1, 2 or more times in each deposition cycle. The deposition cycle is repeated 1, 2 or more times to deposit a metal nitride of the desired thickness. In some embodiments the first reactant comprising a nitrogen source and the second reactant comprising a nitrogen source are the same. In some embodiments the first reactant comprising a nitrogen source and the second reactant comprising a nitrogen source are different.

In some embodiments the growth rate per cycle (GPC) of the silicon nitride is greater than the GPC of a silicon nitride process that does not utilize a deposition enhancing precursor in at least one cycle. In some embodiments the GPC of the silicon nitride process may be 2, 3 or more times greater than that of a silicon ALD process that does not utilize the deposition enhancing precursor.

In some embodiments, the deposited oxide or nitride films comprise one or more impurities. For example, in some embodiments the deposited film comprises less than about 20 at % carbon, less than about 10 at % carbon, less than about 5 at % carbon, less than about 2 at % carbon, less than about 1 at % carbon or less than about 0.5 at % oxygen. In some embodiments the deposited film comprises less than about 20 at % oxygen, less than about 10 at % oxygen, less than about 5 at % oxygen, less than about 2 at % oxygen, less than about 1 at % oxygen or less than about 0.5 at % oxygen. In some embodiments the deposited film comprises less than about 10 at % halides, less than about 5 at % halide, less than about 2 at % halides, less than about 1 at % halides or less than about 0.5 at % halides. In some embodiments the deposited film comprises less than about 20 at % of Mg or other Group II metal, less than about 10 at % Mg or other Group II metal, less than about 5 at % Mg or other Group II metal, less than about 2 at % Mg or other Group II metal, less than about 1 at % Mg or other Group II metal, or less than about 0.5 at % Mg or other Group II metal. The above at % do not count hydrogen impurities.

In some embodiments the deposited films have a resistivity of less than 10000 microOhmcm, less than 5000 microOhmcm, less than 2500 microOhmcm, less than 1500 microOhmcm, less than 1000 microOhmcm, less than 750 microOhmcm, less than 500 microOhmcm, less than 300 microOhmcm, less than 200 microOhmcm, or less than 150 microOhmcm.

The oxide and nitride thin films deposited by the methods disclosed herein may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in aspect ratios of more than about 2 and aspect ratios more than about 3, preferably in aspect ratios more than 5, more preferably in aspect ratios more than 10 and most preferably in aspect ratios more than 15. In some embodiments deposited films may exhibit substantially the same or better conformality than the corresponding films deposited by an ALD process using the same precursors but without the use of a deposition enhancing precursor.

As mentioned above oxide and nitride films can be deposited by an ALD process comprising a deposition cycle, also referred to as a deposition super-cycle, which includes a first deposition-enhancing sub-cycle and a second oxide or nitride deposition sub-cycle. Each of the two sub-cycles can be repeated a predetermined number of times, or at a predetermined ratio in a super-cycle to form oxide or nitride films of the desired thickness.

In some embodiments the oxide or nitride films are deposited by a process that may comprise multiple super-cycles, where at least one super-cycle comprises at least one deposition enhancing sub-cycle and at least one oxide or nitride deposition sub-cycle. In some embodiments the oxide or nitride films are deposited by a process that comprises multiple super-cycles, where each super-cycle comprises at least one deposition enhancing sub-cycle and at least one oxide or nitride deposition sub-cycle. In some embodiments the oxide or nitride films are deposited by a process that comprises multiple super-cycles, where two or more super-cycles comprise at least one deposition enhancing sub-cycle and at least one oxide or nitride deposition sub-cycle. The number of super-cycles in a deposition process that include at least one deposition enhancing sub-cycles can be selected to deposit a film with the desired composition and characteristics. Further, the number (or ratio) of each of the sub-cycles in each super-cycle can be varied to deposit a film with the desired composition, characteristics at a desirable deposition rate, and the number of super-cycles can be selected to deposit a film of the desired thickness. In some embodiments, the number of each sub-cycle conducted consecutively in a super-cycle is selected to deposit the desired film at a desired rate.

Although referred to as the first deposition-enhancing sub-cycle and the second oxide or nitride (or oxynitride) deposition sub-cycle, this is for convenience only, and in some embodiments one or more super-cycles begins with the oxide or nitride deposition sub-cycle, which is followed (after repeating a desired number of times) by the deposition-enhancing sub-cycle (which may also be repeated a desired number of times before beginning another super-cycle). In some embodiments the deposition enhancing sub-cycle is included in each super-cycle. In some embodiments the deposition enhancing sub-cycle is not carried out in at least one super-cycle, such that the at least one super-cycle includes only the oxide or nitride deposition sub-cycle.

The deposition super-cycle can be written as:

$$h \cdot (k \cdot (Z+m \cdot Y)+i \cdot (MX+n \cdot Y)) \text{ or } h \cdot (k \cdot (m \cdot Y+Z)+i \cdot (MX+n \cdot Y)),$$

where h is the number of deposition cycles, k is the number of deposition enahncing sub-cycles, and i is the number of oxide or nitride deposition sub-cycles. h, k and i are integers 1, 2, 3, 4, etc . . . , and n and m are either 0 or 1, with the caveat that both n and m cannot both be 0. Furthermore, Z, Y and MX describe the reactants, where Z is a deposition-enhancing precursor, Y is a nitrogen or oxygen source (or in case of oxynitride formation comprises both oxygen and nitrogen) and MX is a metal or silicon precursor, such as a transition metal halide or silicon halide where M is a transition metal (or silicon) and X is a halide. In the case where m is 0, no nitrogen or oxygen source Y is provided in the deposition enhancing sub-cycle. In the case where n is 0, no nitrogen or oxygen source is provided in the oxide or nitride deposition sub-cycle. As mentioned above, in some embodiments the deposition enhancing sub-cycle may not be provided in each complete deposition cycle, such that in those cycles k would b 0.

A desired number of first sub-cycle k and second sub-cycle i may be provided in each deposition cycle h in order to deposit a film with the desired characteristics. For example, in the case of deposition of TiN from $TiCl_4$ and $NH_3$, $MgCp_2$ can be used as a deposition enhancing precursor and the pulsing formula can for be written as:

$$h \cdot (2 \cdot (MgCp_2 + NH_3) + 7 \cdot (TiCl_4 + NH_3)).$$

In this case the deposition-enhancing sub-cycle is carried out two times in each deposition cycle and the TiN deposition sub-cycle is carried out 7 times in each deposition cycle. In some embodiments the first and second sub-cycles (k and i) may be provided at a selected ratio to deposit a thin film with a desired composition and desired properties.

FIG. 1 illustrates an ALD process for forming a film comprising a transition metal nitride on a substrate in a reaction chamber comprising multiple ALD super-cycles 100. Each super-cycle comprises a first deposition enhancing sub-cycle 200 and a second transition metal nitride deposition sub-cycle 300. The super-cycle 100 is repeated as many times as desired to deposit a transition metal nitride film of the desired thickness. The number of sub-cycles 200 and 300 within the super-cycle 100 may be selected to achieve a film with the desired composition and properties.

The first deposition enhancing sub-cycle comprises:
pulsing a vapor phase deposition enhancing precursor, such as $MgCp_2$, into the reaction chamber 210 to contact the substrate;
purging the reaction chamber 220 to remove excess deposition enhancing precursor and reaction by products, if any;
pulsing the nitrogen reactant, such as $NH_3$ into the reaction chamber 230;
purging the reaction chamber 340 to remove excess reactant and reaction by-products, if any; and
repeating 250 the pulsing and purging steps.

In some embodiments, the first deposition enhancing sub-cycle is repeated 1, 2, 3, 4, 5, 10, 20, 50, 100, or more times in succession. In some embodiments the deposition enhancing sub-cycle is repeated about 1 to 10 times.

The atomic layer deposition super-cycle 100 for forming the transition metal nitride film also comprises one or more second metal nitride deposition sub-cycles 300. In some embodiments, the second metal nitride sub-cycle 300 comprises:
pulsing a vaporized transition metal precursor, such as a transition metal halide, into the reaction chamber 310;
purging the reaction chamber 320 to remove excess transition metal precursor and reaction by products, if any;
providing a pulse of a nitrogen reactant, such as $NH_3$, into the reaction chamber 330, where the nitrogen reactant contributes at least some nitrogen to the transition metal nitride film;
purging the reaction chamber 340 to remove excess nitrogen reactant and any gaseous by-products; and
repeating 350 the pulsing and purging steps.

In some embodiments, the second metal nitride deposition sub-cycle 300 is repeated 1, 2, 3, 4, 5, 10, 20, 50, 100 or more times in succession. In some embodiments the second reducing sub-cycle is repeated about 1 to 10 times.

The first and second sub-cycles 200, 300 are repeated multiple times in a complete ALD super-cycle 100, and the complete ALD super-cycle 100 is repeated to form a transition metal nitride film of a desired thickness and having the desired characteristics.

In some embodiments, the number of times the first deposition enhancing sub-cycle 200 and second metal nitride sub-cycle 300 are repeated is the same in each complete ALD super-cycle 100. In other embodiments, the number of first and second sub-cycles 100, 200 varies in one or more complete ALD super-cycles 100. The number of first and second sub-cycles 100, 200 in each complete ALD super-cycle 100 and the total number of first and second sub-cycles 100, 200 and total ALD super-cycles 100 can be adjusted to achieve deposition of a transition metal nitride film of a desired thickness and composition.

Although illustrated as beginning with the first sub-cycle 200, each complete ALD cycle may begin and end with either the first 200 or second 300 sub-cycle. In some embodiments one or more super-cycles may begin with the metal nitride sub-cycle.

Transition metal oxide films, silicon nitride films, and silicon oxide films may be deposited by similar processes by substituting the appropriate precursors.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A thermal atomic layer deposition (ALD) process for forming a $SiO_2$ thin film comprising a plurality of deposition cycles, at least one deposition cycle comprising a first sub-cycle and a second sub-cycle, wherein:
   the first sub-cycle comprises alternately and sequentially contacting the substrate with a deposition enhancing precursor comprising a Group II metal and one or more cyclopentadienyl ligands and an oxygen reactant; and
   the second sub-cycle comprises alternately and sequentially contacting a substrate with a silicon halide precursor and the same oxygen reactant, and
   wherein the $SiO_2$ thin film comprises less than about 10% at % of the Group II metal,
   wherein the first sub-cycle and the second sub-cycle are each repeated two or more times in succession in the deposition cycle, and
   wherein the process has a growth rate per deposition cycle that is at least 1.5 times greater than the growth rate per deposition cycle of a process comprising only the second sub-cycle and in which the substrate is not contacted with a deposition enhancing precursor.

* * * * *